(12) United States Patent
Ryu

(10) Patent No.: US 10,555,416 B2
(45) Date of Patent: Feb. 4, 2020

(54) PRINTED CIRCUIT BOARD DEVICE AND ELECTRONIC DEVICE COMPRISING SAME

(71) Applicant: Samsung Electronics Co., Ltd., Gyeonggi-do (KR)

(72) Inventor: Wan Sang Ryu, Gyonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/750,095

(22) PCT Filed: Jun. 17, 2016

(86) PCT No.: PCT/KR2016/006484
§ 371 (c)(1),
(2) Date: Feb. 2, 2018

(87) PCT Pub. No.: WO2017/039128
PCT Pub. Date: Mar. 9, 2017

(65) Prior Publication Data
US 2019/0008039 A1    Jan. 3, 2019

(30) Foreign Application Priority Data

Sep. 2, 2015 (KR) .................. 10-2015-0124480

(51) Int. Cl.
H05K 1/02        (2006.01)
H05K 9/00        (2006.01)
H05K 1/18        (2006.01)

(52) U.S. Cl.
CPC ......... H05K 1/0296 (2013.01); H05K 1/0292 (2013.01); H05K 9/0039 (2013.01);
(Continued)

(58) Field of Classification Search
CPC ....... H05K 1/0296; H05K 1/18; H05K 9/0039
See application file for complete search history.

(56) References Cited

U.S. PATENT DOCUMENTS 6,646,521 B1   11/2003  Huang
6,804,099 B2   10/2004  Michon et al.
(Continued)

FOREIGN PATENT DOCUMENTS

KR    1020070014815    2/2007
KR     100839252       6/2008
(Continued)

OTHER PUBLICATIONS

PCT/ISA/210 Search Report issued on PCT/KR2016/006484 (pp. 5).
PCT/ISA/237 Written Opinion issued on PCT/KR2016/006484 (pp. 6).

Primary Examiner — William H Mayo, III
Assistant Examiner — Hiram E Gonzalez
(74) Attorney, Agent, or Firm — The Farrell Law Firm, P.C.

(57) ABSTRACT

Disclosed in various examples of the present application is an electronic device comprising: first and second conductive patterns electrically connected to a communication circuit; a conductive material electrically connected between the first and second conductive patterns; a third conductive pattern spaced apart in a first direction from the first and/or second conductive patterns; and a fourth conductive pattern spaced apart in a second direction opposite to the first direction from the first and/or second conductive patterns, wherein each of the first and second conductive patterns comprises a first part of a first width and a second part of a second width wider than the first width, and the conductive material is arranged on at least a portion of the second part of the first conductive pattern and the second part of the second conductive pattern.

14 Claims, 9 Drawing Sheets

(52) U.S. Cl.
CPC ........... *H05K 1/0243* (2013.01); *H05K 1/181* (2013.01); *H05K 2201/10098* (2013.01)

(56) References Cited

U.S. PATENT DOCUMENTS

| | | | |
|---|---|---|---|
| 6,963,478 B2 | 11/2005 | Michon et al. | |
| 7,109,817 B2* | 9/2006 | Kolb | H04B 15/02 |
| | | | 174/250 |
| 7,180,005 B2* | 2/2007 | Urano | H01L 23/49816 |
| | | | 174/255 |
| 8,462,056 B2* | 6/2013 | Byun | H01Q 1/244 |
| | | | 343/702 |
| 8,681,062 B2 | 3/2014 | Itoh et al. | |
| 9,036,358 B2* | 5/2015 | Shoji | G06F 1/16 |
| | | | 174/255 |
| 2002/0145840 A1 | 10/2002 | Michon et al. | |
| 2005/0036263 A1 | 2/2005 | Michon et al. | |
| 2008/0123335 A1* | 5/2008 | Yoo | G02F 1/13452 |
| | | | 362/257 |
| 2011/0187608 A1 | 8/2011 | Byun et al. | |
| 2012/0176293 A1 | 7/2012 | Itho et al. | |

FOREIGN PATENT DOCUMENTS

| | | |
|---|---|---|
| KR | 1020110088732 | 8/2011 |
| KR | 1020120049918 | 5/2012 |

\* cited by examiner

PRINTED CIRCUIT BOARD DEVICE AND ELECTRONIC DEVICE COMPRISING SAME

PRIORITY

This application is a National Phase Entry of PCT International Application No. PCT/KR2016/006484 which was filed on Jun. 17, 2016, and claims priority to Korean Patent Application No. 10-2015-0124480, which was filed on Sep. 2, 2015, the content of each of which is incorporated herein by reference.

TECHNICAL FIELD

Various embodiments of the present invention relate to signal wiring and device arrangement on a printed circuit board.

BACKGROUND ART

Various tests and calibration works for radio frequency (RF) performance may be conducted to develop/mass-produce electronic devices having a network function. RF connectors may be used for product development, but may not be used for mass production. Alternatively, in the case of producing various functional products by using the same printed circuit board in common, RF connectors may or may not be used depending on product specifications. As described above, in the related art, a separate bypass route is configured for processing depending on whether RF connectors are used or not.

DETAILED DESCRIPTION OF THE INVENTION

Technical Problem

Accordingly, the electronic devices may require an additional space, a bypass line, and the like on a printed circuit board to configure the bypass route. Furthermore, due to the detour of signal wiring, output of a signal applied to the signal wiring may be attenuated, or it may be necessary to additionally mount a passive element to compensate for the signal attenuation.

Various embodiments provide a printed circuit board device for effectively providing signal wiring and an electronic device including the same.

Technical Solution

An electronic device according to various embodiments of the present invention includes a housing, a printed circuit board disposed inside the housing, a communication circuit disposed on the printed circuit board, a first conductive pattern and a second conductive pattern electrically connected with the communication circuit, a conductive material electrically connected between the first conductive pattern and the second conductive pattern, a third conductive pattern spaced apart from the first conductive pattern and/or the second conductive pattern in a first direction, and a fourth conductive pattern spaced apart from the first conductive pattern and/or the second conductive pattern in a second direction opposite to the first direction. The first conductive pattern and the second conductive pattern each include a first part having a first width and a second part having a second width greater than the first width, and at least a part of the conductive material is disposed on the second part of the first conductive pattern and the second part of the second conductive pattern.

Other aspects, advantages, and salient features of the invention will become apparent to those skilled in the art from the following detailed description, which, taken in conjunction with the annexed drawings, discloses various embodiments of the present invention.

Advantageous Effects of the Invention

According to various embodiments of the present invention, it is possible to provide the shortest path in a signal operating process of a specified processor and to reduce the consequential signal loss.

In addition, the present invention may provide various effects derived through the present specification.

BEST MODE

Figure 1:
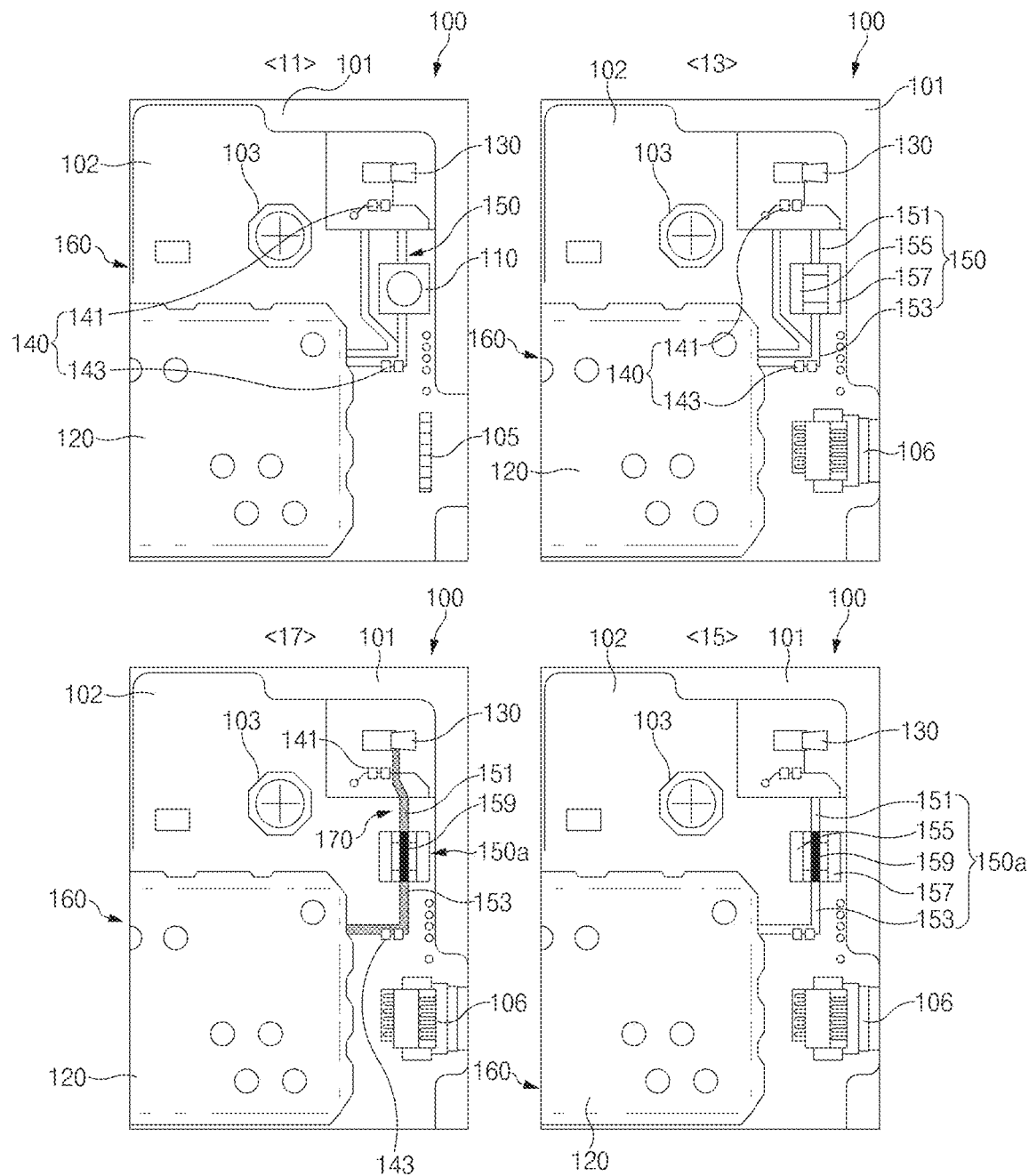
FIG. 1 illustrates a partial configuration of an electronic device according to an embodiment.

Hereinafter, various embodiments of the present invention may be described with reference to accompanying drawings. Accordingly, those of ordinary skill in the art will recognize that modification, equivalent, and/or alternative on the various embodiments described herein can be variously made without departing from the scope and spirit of the present invention. With regard to description of drawings, similar elements may be marked by similar reference numerals.

In this invention, the expressions "have", "may have", "include" and "comprise", or "may include" and "may comprise" used herein indicate existence of corresponding features (e.g., elements such as numeric values, functions, operations, or components) but do not exclude presence of additional features.

In this invention, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in this invention may be used to refer to various elements regardless of the order and/or the priority and to distinguish the relevant elements from other elements, but do not limit the elements. For example, "a first user device" and "a second user device" indicate different user devices regardless of the order or priority. For example, without departing the scope of the present invention, a first element may be referred to as a second element, and similarly, a second element may be referred to as a first element.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there are no intervening element (e.g., a third element).

According to the situation, the expression "configured to" used in this invention may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in this invention are used to describe specified embodiments and are not intended to limit the scope of the present invention. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of this invention. In some cases, even if terms are terms which are defined in this invention, they may not be interpreted to exclude embodiments of this invention.

An electronic device according to various embodiments of this invention may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices. According to various embodiments, the wearable device may include at least one of an accessory type (e.g., watches, rings, bracelets, anklets, necklaces, glasses, contact lens, or head-mounted-devices (HMDs), a fabric or garment-integrated type (e.g., an electronic apparel), a body-attached type (e.g., a skin pad or tattoos), or a bio-implantable type (e.g., an implantable circuit).

According to various embodiments, the electronic device may be a home appliance. The home appliances may include at least one of, for example, televisions (TVs), digital versatile disk (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, Global Navigation Satellite System (GNSS), event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of this invention may not be limited to the above-described electronic devices and may include other electronic devices and new electronic devices according to the development of technologies.

Hereinafter, electronic devices according to various embodiments will be described with reference to the accompanying drawings. In this invention, the term "user" may refer to a person who uses an electronic device or may refer to a device (e.g., an artificial intelligence electronic device) that uses the electronic device.

FIG. 1 illustrates a partial configuration of an electronic device according to an embodiment.

Referring to <11> of FIG. 1, an electronic device 100 according to an embodiment may include at least a part of a printed circuit board device 160 (hereinafter, referred to as the printed circuit board device 160) and at least a part of a housing 101 (hereinafter, referred to as the housing 101).

According to various embodiment of the present invention, the printed circuit board device 160 may include a printed circuit board 102, an RF connector 110, a connector connecting part 150, and a physical element 140. Additionally, the printed circuit board device 160 may further include a fixing member 103 for fixing the printed circuit board 102 to the housing 101 and a connecting interface 106. For example, the fixing member 103 may pass through front and rear surfaces of the printed circuit board 102 from one side thereof and may be coupled to the housing 101, which is disposed on the rear surface of the printed circuit board 102, to fix the printed circuit board 102. The fixing member 103 may be, for example, a screw member. According to various embodiments, the fixing member 103 may be replaced with a hook member. The connecting interface 106 may be a component that is disposed on a side of the printed circuit board 102 and into which an external connector is inserted. The connecting interface 106 may be omitted according to characteristics of the printed circuit board 102. The connecting interface 106 may be mounted on a connection part 105.

According to various embodiments of the present invention, the printed circuit board 102 may include a substrate having a predetermined surface and thickness, and electronic circuits (e.g., a processor 120, the physical element 140, the connector connecting part, the RF connector 110, a contact part 130, and the like) may be mounted on the substrate. The printed circuit board 102 may be formed, for example, in a plurality of layers and may have an insulating material (or an insulation layer) coated on at least a part of the front and rear surfaces thereof. The printed circuit board 102 may have, on a side thereof, a through-hole in which the above-described fixing member 103 is disposed. The printed circuit board 102 may be fixed to the housing 101 by the fixing member 103.

According to an embodiment, an electronic circuit associated with executing a specific function may be disposed on the printed circuit board 102. The electronic circuit may include the processor 120 and the contact part 130. Additionally, the electronic circuit may further include a connector connecting part that includes a first pattern connected with the processor and a second pattern for connecting the contact part 130.

According to various embodiments of the present invention, the processor 120 may be a chip having a hardware form and may include at least one of a communication processor (CP), an application processor (AP), a camera chip, and other communication devices (e.g., a Wi-Fi communication chip, an NFC communication chip, a BT communication chip, and the like). According to an embodiment, the processor 120 may perform signal processing associated with a communication function. As illustrated in the drawing, the processor 120 may include a protective case for protecting the outside of the chip. The processor 120 may be electrically connected with the contact part 130 through the connector connecting part 150.

According to various embodiments of the present invention, the contact part 130 may be disposed on a side of the printed circuit board 102 and may be brought into contact with other components of the electronic device 100, for example, a carrier having an antenna pattern. Alternatively, according to various embodiments, the contact part 130 may also serve as a contact point brought into contact with another printed circuit board 102. The contact part 130 may have, for example, a clip shape for electrical connection with another component. Alternatively, the contact part 130 may have a dome shape. In the following description, the contact part 130 will be described as having the shape of an antenna contact part.

According to various embodiments of the present invention, the connector connecting part 150 may be disposed between the processor 120 and the contact part 130. The RF connector 110 may be mounted on the connector connecting part 150. In the illustrated state <11>, the connector connecting part 150 may be hidden by the RF connector 110.

According to various embodiments of the present invention, the RF connector 110 may be mounted on the connector connecting part 150 and may be electrically connected to the processor 120. For example, an antenna may be connected to the RF connector 110. According to an embodiment, the RF connector 110 may radiate an electrical signal of the processor 120 through the connected antenna or may forward an external signal received by the connected antenna to the processor 120. According to an embodiment, the RF connector 110 may be removed from the printed circuit board 102. If the RF connector 110 is removed, the connector connecting part 150 may be exposed.

According to various embodiments of the present invention, the connector connecting part 150 may include interconnection wires (e.g., a first pattern 151) for electrically connecting physical elements 141 disposed between the connector connecting part 150 and the contact part 130. The connector connecting part 150 may include interconnection wires (e.g., a second pattern 153) for electrically connecting physical elements 143 disposed between the connector connecting part 150 and the processor 120 to the processor 120.

According to various embodiments of the present invention, the physical element 140 may include at least one of the physical elements 143 and the physical elements 141. For example, the physical elements 143 may be disposed between the processor 120 and the RF connector 110 (or the connector connecting part 150). The physical elements 141 may be disposed between the RF connector 110 and the contact part 130. The physical element 140 may include at least one of, for example, at least one capacitor, at least one inductor, and at least one resistance element. The physical elements 143 may support, for example, an impedance matching function of the RF connector 110. The physical elements 141 may support, for example, an impedance mapping function of the contact part 130. The type and characteristic of the physical element 140 may vary depending on the operating frequency band of the processor 120, the type of antenna connected to the RF connector 110, the type of antenna connected to the contact part 130, or the like.

According to various embodiments, as in a state <13>, the electronic device 100 may have a state in which the RF connector 110 is removed. As described in the state <11>, the electronic device 100, from which the RF connector 110 is removed, may include the printed circuit board device 160 and the housing 101, but the RF connector 110 may be excluded from the printed circuit board device 160. In response, the connector connecting part 150 may be exposed to the outside.

According to various embodiments of the present invention, the connector connecting part 150 according to an embodiment may include the first pattern 151 connected with the contact part 130 and the second pattern 153 connected with the processor 120, in which the second pattern 153 is spaced apart from the first pattern 151 by a predetermined interval and has at least a part disposed to face one end of the first pattern 151. Additionally, the connector connecting part 150 may include a third pattern 155 and a fourth pattern 157 that are closely disposed within a specified distance with respect to the position where the first pattern and the second pattern 153 are spaced apart from each other by the predetermined interval. The third pattern 155 and the fourth pattern 157 according to an embodiment may serve as a ground terminal of the RF connector 110.

According to various embodiments, as in a state <15>, the electronic device 100 may include the printed circuit board device 160 and the housing 101 and may include a pattern area section 150a in which a part of a connector connecting part included in the printed circuit board device 160 is deformed. For example, an (RF) connector may be mounted on the pattern area section 150a. Furthermore, the connector mounted on the pattern area section 150a may be removed in an electronic device manufacturing process.

According to an embodiment, the pattern area section 150a may be, for example, an area in which at least one conductive pattern is disposed. Alternatively, the pattern area section 150*a* may be an area in which a conductive material is arranged in predetermined patterns. The pattern area section 150*a* may include the first pattern 151 connected with the contact part 130, the second pattern 153 connected with the processor 120 and having one distal end spaced apart from the first pattern 151 by a predetermined interval, and a connecting part, for example, a conductive material 159 for electrically connecting the first pattern 151 and the second pattern 153.

According to various embodiments of the present invention, the conductive material 159 may connect separated ends of the connector connecting part 150 represented in the state <13>. For example, the conductive material 159 may electrically connect disconnection (e.g., between the first pattern 151 and the second pattern 153) on a signal line connecting the contact part 130 and the processor 120. In the state <11>, the RF connector 110 may be placed on the connector connecting part 150, and the RF connector 110 may be electrically connected with the processor 120. With the removal of the RF connector 110, the connector connecting part 150 may not electrically connect the processor 120 and the contact part 130. Accordingly, the electronic device 100 may form the pattern area section 150*a* by using the conductive material 159 to electrically connect the contact part 130 and the processor 120.

According to various embodiments, the pattern area section 150*a* may include the third pattern 155 and the fourth pattern 157 disposed in an area adjacent to the area where the conductive material 159 is disposed. The third pattern 155 and the fourth pattern 157 may be disposed to be spaced apart from each other by a predetermined interval and may be disposed to be symmetric to each other. The third pattern 155 and the fourth pattern 157 may serve as a ground terminal of the RF connector 110 mounted on the connector connecting part 150.

According to various embodiments, as in a state <17>, the electronic device 100 may include a signal path 170 for connecting the processor 120, the second pattern 153, the conductive material 159, the first pattern 151, and the contact part 130. According to various embodiments, the physical elements 143 and the physical elements 141 may be further disposed in the signal path 170. For example, the physical elements 143 may be disposed on a side of the second pattern 153 connected to the processor 120, and the physical elements 141 may be disposed on a side of the first pattern 151 connected to the contact part 130. In the above-described structure, a signal output from the processor 120 may be transmitted through the second pattern 153, the conductive material 159, the first pattern 151, and the contact part 130. Furthermore, a signal received by the contact part 130 may be transmitted to the processor 120 through the first pattern 151, the conductive material 159, and the second pattern 153. As illustrated in the drawing, the signal path 170 may directly connect the processor 120 and the contact part 130 to decrease an interconnection wiring loss and reduce the consequential signal distortion.

Figure 2:
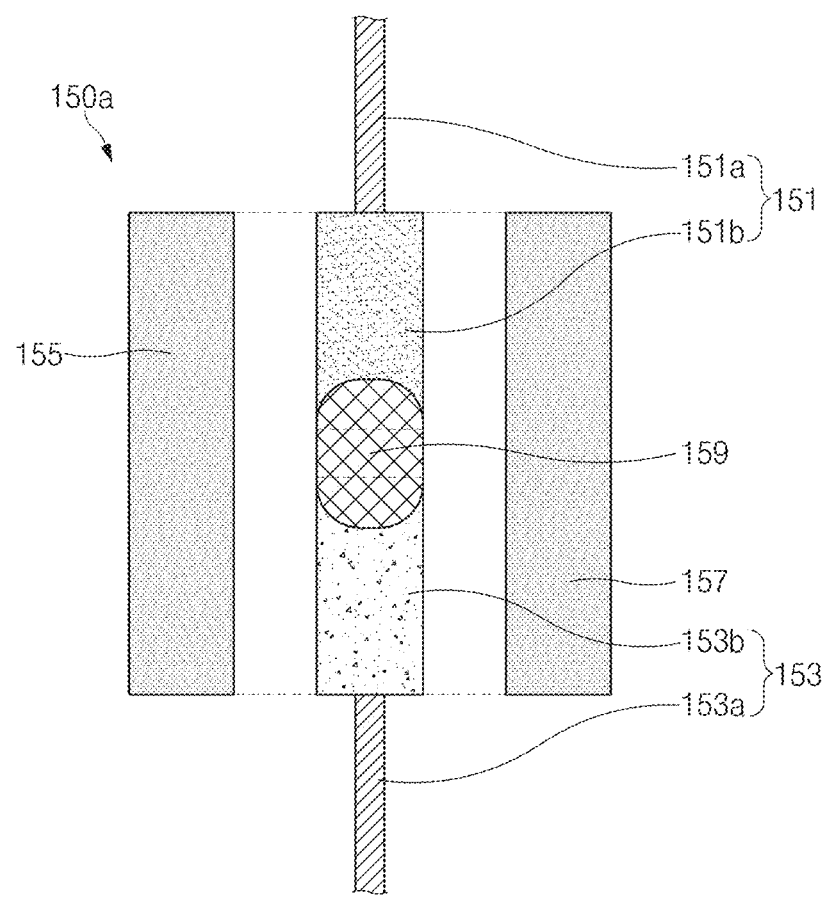
FIG. 2 illustrates one form of a pattern area section according to an embodiment.

FIG. 2 illustrates one form of a pattern area section according to an embodiment.

Referring to FIG. 2, according to various embodiments of the present invention, the pattern area section 150*a* may include the first pattern 151, the second pattern 153, the third pattern 155, the fourth pattern 157, and the conductive material 159. The pattern area section 150*a* may have a state in which the conductive material 159 electrically connects a separation area between the first pattern 151 and the second pattern 153. The elements of the pattern area section 150*a* may be formed of conductive materials. According to various embodiments, the first pattern 151, the second pattern 153, the third pattern 155, and the fourth pattern 157 may be formed of the same material. The conductive material 159 according to an embodiment may be lead.

According to various embodiments of the present invention, the first pattern 151 may include, for example, a first trace line 151*a* having a first line-width and a predetermined length, one side of which is connected to the contact part 130, and a first connecting pad 151*b* having a second line-width and a predetermined length, one side of which is connected with an opposite side of the first trace line 151*a*. An opposite side of the first connecting pad 151*b* may be disposed to be spaced apart from the second pattern 153 by a predetermined interval. For example, the second line-width may be thicker than the first line-width. The first trace line 151*a* may be hidden by, for example, an insulating material covering at least a part of the front and rear surfaces of the printed circuit board 102. The first connecting pad 151*b* connected with the first trace line 151*a* may be exposed to the outside.

According to various embodiments of the present invention, the second pattern 153 may include, for example, a second trace line 153*a* having a first line-width and a predetermined length, one side of which is connected to the processor 120, and a second connecting pad 153*b* having a second line-width and a predetermined length, one side of which is connected with an opposite side of the second trace line 153*a*. An opposite side of the second connecting pad 153*b* may be disposed to be spaced apart from the first connecting pad 151*b* of the first pattern 151 by a predetermined interval. The second trace line 153*a* may be hidden by, for example, an insulating material covering at least a part of the front and rear surfaces of the printed circuit board 102. The second connecting pad 153*b* connected with the second trace line 153*a* may be exposed to the outside. The line-widths of the first trace line 151*a* and the second trace line 153*a* may be similar to or the same as each other. Furthermore, the line-widths of the first connecting pad 151*b* and the second connecting pad 153*b* may be similar to or the same as each other.

According to various embodiments of the present invention, at least a part of the conductive material 159 may be disposed on at least a part of a distal end of the first connecting pad 151*b*. At least a part of the conductive material 159 may be disposed on at least a part of a distal end of the second connecting pad 153*b*. According to an embodiment, the first connecting pad 151*b* and the second connecting pad 153*b* may be disposed to face each other in a state of being spaced apart from each other by a predetermined interval, and the conductive material 159 may be disposed on the separation area to electrically connect the distal end of the first connecting pad 151*b* and the distal end of the second connecting pad 153*b*.

According to various embodiments, the third pattern 155 and the fourth pattern 157 may be disposed side by side with the first connecting pad 151*b* and the second connecting pad 153*b*. According to an embodiment, the third pattern 155 may be disposed side by side on a left side of the first connecting pad 151*b*, and the fourth pattern 157 may be disposed side by side on a right side of the second connecting pad 153*b*. At least one of the third pattern 155 or the fourth pattern 157 may have, for example, the same line-width as the first connecting pad 151*b* or the second connecting pad 153*b*. Alternatively, the third pattern 155 or the fourth pattern 157 may have a thicker line-width than the first connecting pad 151*b* or the second connecting pad 153b. The third pattern 155 or the fourth pattern 157 may have, for example, a length that includes the length of the first connecting pad 151b, the length of the second connecting pad 153b, and the separation width therebetween. The third pattern 155 and the fourth pattern 157 may be exposed to the outside.

According to various embodiments of the present invention, the width from an edge of the third pattern 155 to an edge of the fourth pattern 157 may range, for example, from about 1 to about 5 mm. The first pattern 151 and the second pattern 153 may be spaced apart from the third pattern 155 and the fourth pattern 157 by a predetermined interval. According to an embodiment, the sum of the line-widths of the first pattern 151 (or the second pattern 153), the third pattern 155, and the fourth pattern 157, the separation distance between the first pattern 151 and the third pattern 155, and the separation distance between the first pattern 151 and the fourth pattern 157 may be equal to, for example, 3 mm. The above-described total width may vary depending on characteristics of the RF connector 110.

Figure 3A:
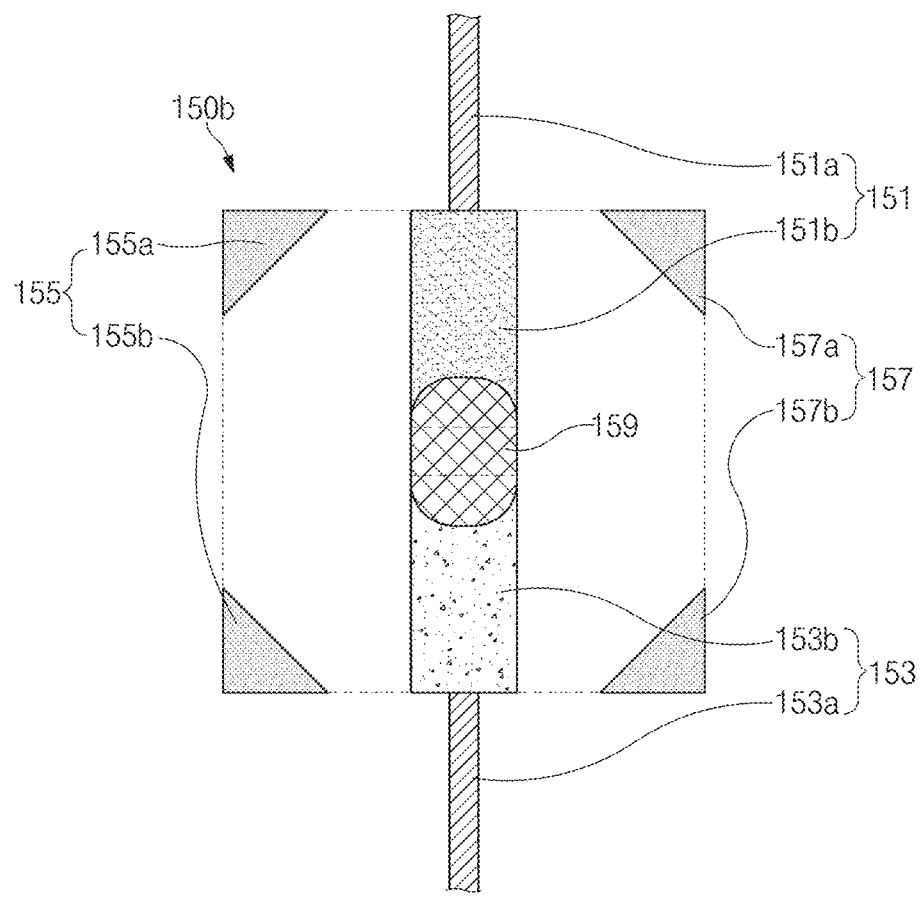
FIG. 3A illustrates a form of a pattern area section having a plurality of adjacent patterns according to an embodiment.

FIG. 3A illustrates a form of a pattern area section having a plurality of adjacent patterns according to an embodiment.

Referring to FIG. 3A, according to various embodiments of the present invention, a pattern area section 150b may include, for example, the first pattern 151, the second pattern 153, the third pattern 155, the fourth pattern 157, and the conductive material 159. The pattern area section 150b may include substantially the same elements except the third pattern 155 and the fourth pattern 157, compared to the pattern area section 150a illustrated in FIG. 2. For example, the first pattern 151 may include the first trace line 151a and the first connecting pad 151b, and the second pattern 153 may include the second trace line 153a and the second connecting pad 153b. The first connecting pad 151b and the second connecting pad 153b may be electrically connected by the conductive material 159.

According to various embodiments of the present invention, the third pattern 155 may include, for example, a first corner pattern 155a and a second corner pattern 155b. The first corner pattern 155a may have, for example, a triangular shape. For example, the first corner pattern 155a may be disposed at a position spaced apart from the first pattern 151 by a predetermined interval. For example, one vertex of the first corner pattern 155a having a triangular shape may be disposed in a diagonal direction away from the first pattern 151, and one sloping side (e.g., a side facing the one vertex) of the first corner pattern 155a may be disposed in a diagonal direction toward the first pattern 151. The first corner pattern 155a may have, for example, the shape of an isosceles triangle. Alternatively, the first corner pattern 155a may have, for example, the shape of an equilateral triangle. The width of one side of the first corner pattern 155a may be similar to or the same as, for example, the line-width of the first pattern 151. One side of the first corner pattern 155a may be disposed side by side with one end of the first pattern 151.

According to various embodiments of the present invention, the second corner pattern 155b may be disposed at a position spaced apart from the first corner pattern 155a by a predetermined interval. The second corner pattern 155b may be disposed to be symmetric to the first corner pattern 155a with respect to a horizontal center line (e.g., a virtual horizontal center line passing through a mid-point between the first corner pattern 155a and the second corner pattern 155b spaced apart from each other by the predetermined interval). The second corner pattern 155b may be disposed at a position spaced apart from the second pattern 153 by a predetermined interval.

According to various embodiments of the present invention, the fourth pattern 157 may include, for example, a third corner pattern 157a and a fourth corner pattern 157b. For example, the third corner pattern 157a may be disposed at a position spaced apart from the first pattern 151 by a predetermined interval. According to an embodiment, the third corner pattern 157a may be disposed to be symmetric to the first corner pattern 155a with respect to a vertical center line (e.g., a virtual vertical center line (e.g., the vertical center line of the first pattern 151) that passes through a mid-point between the third corner pattern 157a and the first corner pattern 155a spaced apart from each other by the predetermined interval).

The fourth corner pattern 157b may be disposed at a position spaced apart from the third corner pattern 157a by a predetermined interval. Furthermore, the fourth corner pattern 157b may be disposed to be symmetric to the third corner pattern 157a with respect to the virtual horizontal center line. Alternatively, the fourth corner pattern 157b may be disposed to be symmetric to the second corner pattern 155b with respect to the virtual vertical center line.

According to various embodiments of the present invention, the third pattern 155 and the fourth pattern 157 disposed in the plurality of corner areas described above and having a predetermined surface may have various shapes corresponding to, for example, the shape of the RF connector 110. In the case where the RF connector 110 having a different ground structure is applied, the shape of the third pattern 155 and the fourth pattern 157 may be changed.

Figure 3B:
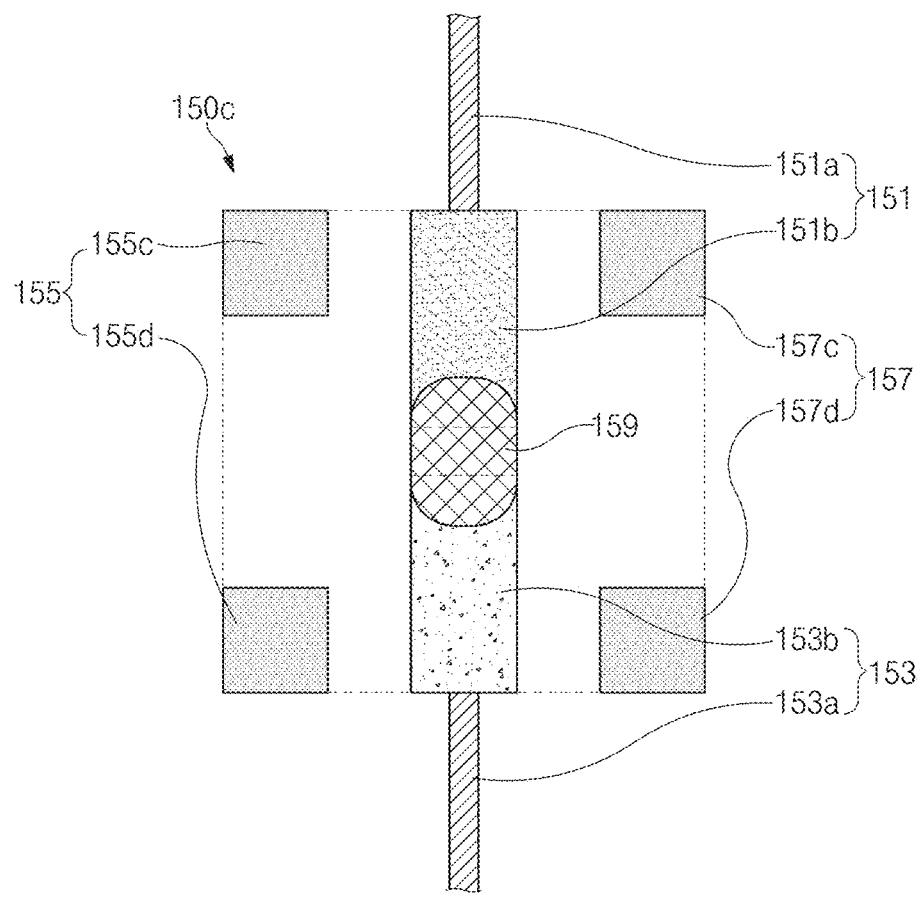
FIG. 3B illustrates a form of a pattern area section having a plurality of adjacent patterns according to an embodiment.

FIG. 3B illustrates a form of a pattern area section having a plurality of adjacent patterns according to an embodiment.

Referring to FIG. 3B, according to various embodiments of the present invention, a pattern area section 150c may include the first pattern 151, the second pattern 153, the third pattern 155, the fourth pattern 157, and the conductive material 159. The first pattern 151, the second pattern 153, and the conductive material 159 may be substantially the same as the elements illustrated in FIG. 2.

According to various embodiments of the present invention, the third pattern 155 may include a first sub-pattern 155c and a second sub-pattern 155d. The fourth pattern 157 may include a third sub-pattern 157c and a fourth sub-pattern 157d. As illustrated in the drawing, the sub-patterns 155c, 155d, 157c, and 157d may have, for example, the shape of a quadrangle (a square or a rectangle). The first sub-pattern 155c and the second sub-pattern 155d may be disposed to be spaced apart from each other by a predetermined interval. According to an embodiment, the first sub-pattern 155c and the second sub-pattern 155d may be similar to or the same as each other in area and shape. The first sub-pattern 155c and the second sub-pattern 155d may be disposed to be symmetric to each other with respect to a virtual horizontal center line passing through a mid-point of the separation distance therebetween. According to various embodiments, the third sub-pattern 157c and the fourth sub-pattern 157d may be disposed to be spaced apart from each other by a predetermined interval. According to an embodiment, the third sub-pattern 157c and the fourth sub-pattern 157d may be similar to or the same as each other in area and shape. The third sub-pattern 157c and the fourth sub-pattern 157d may be disposed to be symmetric to each other with respect to the virtual horizontal center line passing through a mid-point of the separation distance therebetween.

Furthermore, according to various embodiments of the present invention, the first sub-pattern 155*c* and the third sub-pattern 157*c* may be disposed at positions spaced apart from the first pattern 151 by a predetermined interval. For example, the first sub-pattern 155*c* and the third sub-pattern 157*c* may be disposed to be symmetric to each other with respect to the first pattern 151. The second sub-pattern 155*d* and the fourth sub-pattern 157*d* may be disposed at positions spaced apart from the second pattern 153 by a predetermined interval. For example, the second sub-pattern 155*d* and the fourth sub-pattern 157*d* may be disposed to be symmetric to each other with respect to the second pattern 153. Accordingly, the first sub-pattern 155*c* and the fourth sub-pattern 157*d*, and the second sub-pattern 155*d* and the third sub-pattern 157*c*, may be disposed to be symmetric to each other in a diagonal direction.

Figure 4:
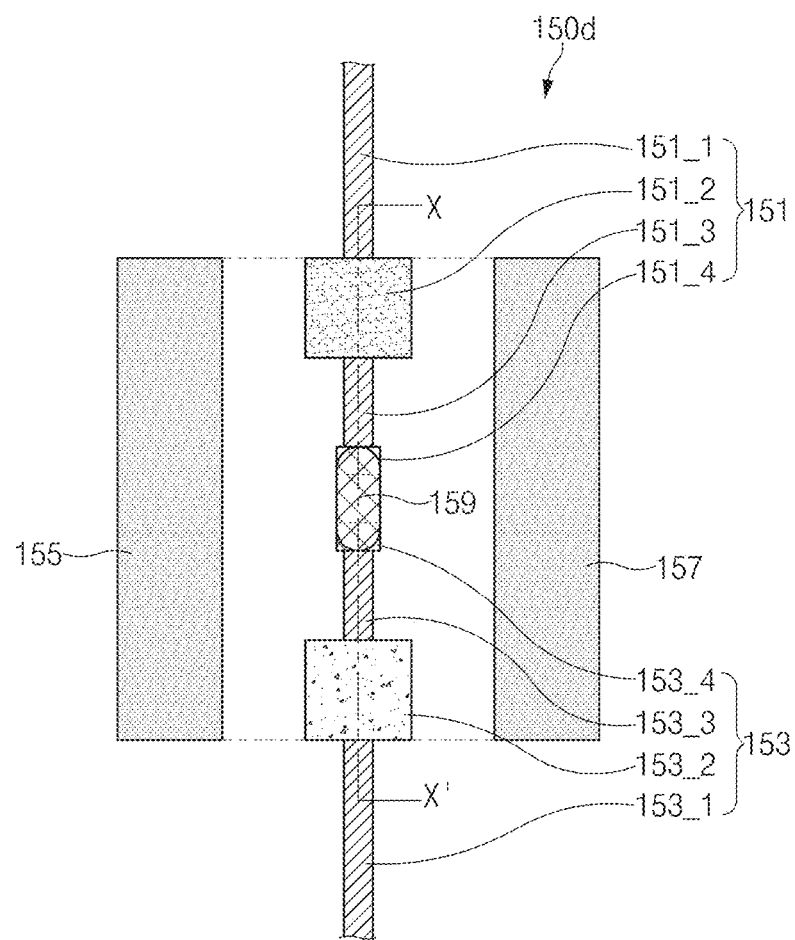
FIG. 4 illustrates another form of a pattern area section according to an embodiment.

FIG. 4 illustrates another form of a pattern area section according to an embodiment.

Referring to FIG. 4, a pattern area section 150*d* may include the first pattern 151, the second pattern 153, the third pattern 155, the fourth pattern 157, and the conductive material 159.

According to various embodiments of the present invention, the first pattern 151 may include a first trace line 151_1, a first line connecting pad 151_2, a first connecting line 151_3, and a first conductive pad 151_4.

According to various embodiments of the present invention, the first trace line 151_1 may have a predetermined line-width and length and may be connected to, for example, the contact part 130 at one side thereof. An opposite side of the first trace line 151_1 may be electrically connected to one side of the first line connecting pad 151_2. The first trace line 151_1 may be hidden by, for example, an insulating material disposed on at least a part of the front and rear surfaces of the printed circuit board 102.

According to various embodiments of the present invention, the first line connecting pad 151_2 may include, for example, a predetermined surface and may be connected to the first trace line 151_1 at one side thereof and the first connecting line 151_3 at an opposite side thereof. According to an embodiment, the first line connecting pad 151_2 may serve as an electrode of an RF connector when the RF connector is connected. The first line connecting pad 151_2 may be disposed to be spaced apart from the third pattern 155 and the fourth pattern 157 by a predetermined interval. The width of the first line connecting pad 151_2 may be formed to be thicker than the line-width of the first trace line 151_1.

According to various embodiments of the present invention, the first connecting line 151_3 may have a predetermined line-width and may be disposed between the first line connecting pad 151_2 and the first conductive pad 151_4. According to an embodiment, the line-width of the first connecting line 151_3 may be similar to or the same as the line-width of the first trace line 151_1. At least a part of the first connecting line 151_3 may be hidden by an insulating material disposed on at least a part of the front and rear surfaces of the printed circuit board 102.

According to various embodiments of the present invention, the first conductive pad 151_4 may be electrically connected to, for example, the first connecting line 151_3 at one side thereof. The first conductive pad 151_4 may be disposed at a position spaced apart from the second pattern 153 by a predetermined interval. The first conductive pad 151_4 may be electrically connected with the second pattern 153 through the conductive material 159. For example, the first conductive pad 151_4 may be formed to be similar to or thicker than the line-width of the first connecting line 151_3. According to various embodiments, the first conductive pad 151_4 may have a smaller thickness than the first line connecting pad 151_2.

According to various embodiments of the present invention, the second pattern 153 may include a second trace line 153_1, a second line connecting pad 153_2, a second connecting line 153_3, and a second conductive pad 153_4.

According to various embodiments of the present invention, the second trace line 153_1 may have a predetermined line-width and length and may be connected to, for example, the processor 120 at one side thereof. An opposite side of the second trace line 153_1 may be electrically connected to one side of the second line connecting pad 153_2. The second trace line 153_1 may be hidden by an insulating material.

According to various embodiments of the present invention, the second line connecting pad 153_2 may be connected to the second trace line 153_1 at one side thereof and the second connecting line 153_3 at an opposite side thereof. According to an embodiment, the second line connecting pad 153_2 may serve as an electrode of an RF connector when the RF connector is connected. The second line connecting pad 153_2 may be disposed to be spaced apart from the third pattern 155 and the fourth pattern 157 by a predetermined interval. The width of the second line connecting pad 153_2 may be formed to be thicker than the line-width of the second trace line 153_1. The second line connecting pad 153_2 may be disposed to be symmetric to, for example, the first line connecting pad 151_2 with respect to a specified virtual horizontal center line.

According to various embodiments of the present invention, the second connecting line 153_3 may have a predetermined line-width and may be disposed between the second line connecting pad 153_2 and the second conductive pad 153_4. According to an embodiment, the line-width of the second connecting line 153_3 may be similar to or the same as the line-width of the second trace line 153_1. At least a part of the second connecting line 153_3 may be hidden by an insulating material. For example, the second connecting line 153_3 may be disposed to be symmetric to the first connecting line 151_3 with respect to a specified virtual horizontal center line.

According to various embodiments of the present invention, the second conductive pad 153_4 may be electrically connected to, for example, the second connecting line 153_3 at one side thereof. The second conductive pad 153_4 may be disposed at a position spaced apart from the first conductive pad 151_4 of the first pattern 151 by a predetermined interval. The second conductive pad 153_4 may be electrically connected with the first conductive pad 151_4 of the first pattern 151 through the conductive material 159. For example, the second conductive pad 153_4 may be formed to be similar to or thicker than the line-width of the second connecting line 153_3. According to various embodiments, the second conductive pad 153_4 may have a smaller thickness than the first line connecting pad 151_2. For example, the second conductive pad 153_4 may be disposed to be symmetric to the first conductive pad 151_4 with respect to a specified virtual horizontal center line.

As described above, according to various embodiments of the present invention, the first conductive pad 151_4 and the second conductive pad 153_4 may be exposed to the outside, and the first connecting line 151_3 connected with the first conductive pad 151_4 and the second connecting line 153_3 connected with the second conductive pad 153_4 may be hidden by an insulating material. Accordingly, while the conductive material 159 for electrically connecting the first conductive pad 151_4 and the second conductive pad 153_4 is being disposed, the conductive material 159 may be located to connect the first conductive pad 151_4 and the second conductive pad 153_4. Consequently, the first conductive pad 151_4 and the second conductive pad 153_4 may be electrically connected.

According to the above-described various embodiments, an electronic device according to an embodiment may include a housing, a printed circuit board disposed inside the housing, a communication circuit disposed on the printed circuit board, a first conductive pattern (e.g., the first pattern 151) and a second conductive pattern (e.g., the second pattern 152) electrically connected with the communication circuit, a conductive material (e.g., the conductive material 159) electrically connected between the first conductive pattern and the second conductive pattern, a third conductive pattern (e.g., the third pattern 153) spaced apart from the first conductive pattern and/or the second conductive pattern in a first direction, and a fourth conductive pattern (e.g., the fourth pattern 154) spaced apart from the first conductive pattern and/or the second conductive pattern in a second direction opposite to the first direction. The first conductive pattern and the second conductive pattern may each include a first part having a first width and a second part having a second width greater than the first width, and at least a part of the conductive material may be disposed on the second part of the first conductive pattern and the second part of the second conductive pattern.

According to various embodiments, the second part of the first conductive pattern and the second part of the second conductive pattern may be disposed in an area surrounded by the third conductive pattern and the fourth conductive pattern.

According to various embodiments, the first part and the second part of the first conductive pattern and the first part and the second part of the second conductive pattern may be arranged on one virtual line in an area surrounded by the third conductive pattern and the fourth conductive pattern.

According to various embodiments, the first conductive pattern and the second conductive pattern may each further include a third part having a third width that is different from the first width and the second width.

According to various embodiments, the first part, the second part, and the third part of the first conductive pattern and the first part, the second part, and the third part of the second conductive pattern may be substantially arranged on one virtual line in an area surrounded by the third conductive pattern and the fourth conductive pattern.

According to various embodiments, the conductive material may include a material that is different from a material included in the first conductive pattern and/or a material included in the second conductive pattern.

According to various embodiments, the electronic device may be configured to not include another electrical path for electrically connecting the first conductive pattern and the second conductive pattern, except the conductive material.

According to various embodiments, the electronic device may further include another material that is disposed between at least a part of the first conductive pattern and/or at least a part of the second conductive pattern and the conductive material and is friendlier to the conductive material than a material included in the first conductive pattern or a material included in the second conductive pattern.

According to various embodiments, the printed circuit board may include at least one ground, and the third conductive pattern and/or the fourth conductive pattern may be electrically connected with the at least one ground.

According to various embodiments, wherein a width between the third conductive pattern and the fourth conductive pattern or a length of the third conductive pattern or the fourth conductive pattern may range from 1 mm to 5 mm.

Figure 5:
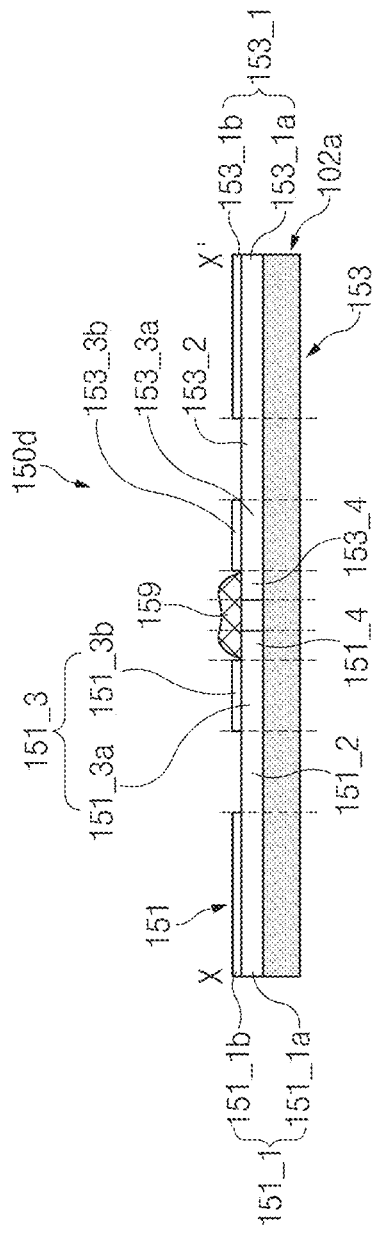
FIG. 5 is a sectional view of a pattern area section, which is taken along a specified cutting line, according to an embodiment.

FIG. 5 is a sectional view of a pattern area section, which is taken along a specified cutting line, according to an embodiment.

Referring to FIG. 5, according to various embodiments of the present invention, the pattern area section 150d may include a conductive line located on a substrate 102a of the printed circuit board 102, insulating materials partly disposed on the conductive line, and the conductive material 159 disposed to connect a disconnection area. The pattern area section 150d may include the first pattern 151 and the second pattern 153 located on the substrate 102a and spaced apart from each other by a predetermined interval.

According to various embodiments of the present invention, as illustrated in FIG. 4, the first pattern 151 may include the first trace line 151_1, the first line connecting pad 151_2, the first connecting line 151_3, and the first conductive pad 151_4. The first trace line 151_1 may include a first trace line layer 151_1a and a first trace insulation layer 151_1b. One side of the first trace line layer 151_1a may be connected to the first line connecting pad 151_2 adjacent thereto, and an opposite side of the first trace line layer 151_1a may be connected to a contact part. The first trace insulation layer 151_1b may be disposed such that the first trace line layer 151_1a is not exposed to the outside.

According to various embodiments of the present invention, the first line connecting pad 151_2 may be disposed in an area where the first trace insulation layer 151_1b is removed without extending. An RF connector may be electrically connected, with the exposure of the first line connecting pad 151_2.

According to various embodiments of the present invention, the first connecting line 151_3 may include a first connecting line layer 151_3a and a first connecting insulation layer 151_3b, similarly to the first trace line 151_1. One side of the first connecting line layer 151_3a may be connected with the first line connecting pad 151_2 adjacent thereto, and an opposite side of the first connecting line layer 151_3a may be connected with the first conductive pad 151_4.

According to various embodiments of the present invention, the first conductive pad 151_4 may be disposed in an area where the first connecting insulation layer 151_3b is removed without extending. A part of the conductive material 159 may be disposed on the first conductive pad 151_4. The first connecting insulation layer 151_3b may be located adjacent to the first conductive pad 151_4 to cover the first connecting line layer 151_3a, and therefore the conductive material 159 may be isolated on the first conductive pad 151_4 without overflowing into the first connecting line layer 151_3a. As described above, the first connecting insulation layer 151_3b may serve as a dam while the conductive material 159 is being formed.

According to various embodiments of the present invention, the second pattern 153 may include the second trace line 153_1, the second line connecting pad 153_2, the second connecting line 153_3, and the second conductive pad 153_4. The aforementioned second trace line 153_1 may include a second trace line layer 153_1a and a second trace insulation layer 153_1b. The second connecting line 153_3 may include a second connecting line layer 153_3a and a second connecting insulation layer 153_3b. The second trace line layer 153_1a, the second line connecting pad 153_2, the second connecting line layer 153_3a, and the second conductive pad 153_4 described above may be electrically connected. Similarly to the adjacent first conductive pad 151_4, the second conductive pad 153_4 may be exposed, and the conductive material 159 may be disposed on the second conductive pad 153_4.

According to various embodiments, the first pattern 151 may include a conductive line extending from the first conductive pad 151_4 and an insulation layer disposed so as not to be partly exposed, and the first conductive pad 151_4 may be electrically connected with the conductive material 159. Similarly to the first pattern 151, the second pattern 153 may include a conductive line extending from the second conductive pad 153_4 and an insulation layer disposed so as not to be partly exposed, and the second conductive pad 153_4 may be electrically connected with the conductive material 159.

Figure 6:
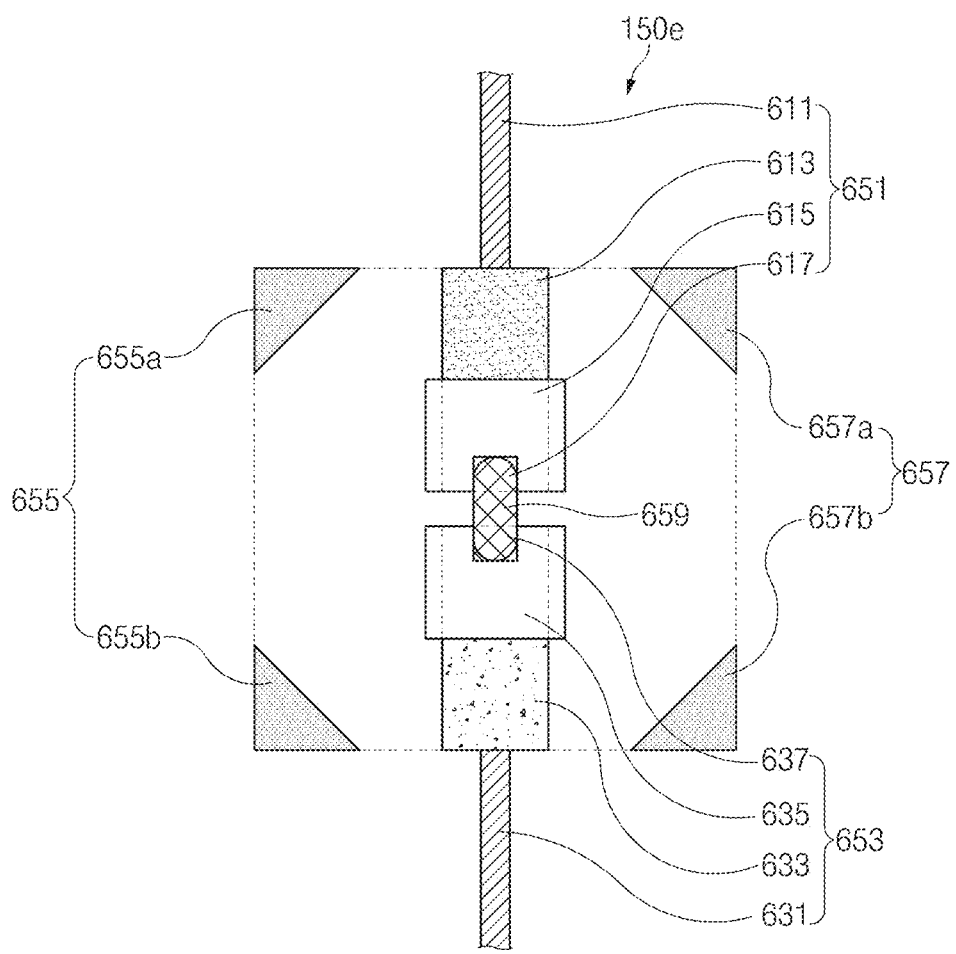
FIG. 6 illustrates another example of a pattern area section according to an embodiment.

FIG. 6 illustrates another example of a pattern area section according to an embodiment.

Referring to FIG. 6, according to various embodiments of the present invention, a pattern area section 150e may include a first pattern 651, a second pattern 653, a third pattern 655, a fourth pattern 657, and a conductive material 659.

According to various embodiments of the present invention, the first pattern 651 may include a first trace line 611, a first line connecting pad 613, and a first insulation layer 615.

According to various embodiments of the present invention, the first trace line 611 may have a predetermined line-width and length and may be connected to, for example, a contact part at one side thereof. An opposite side of the first trace line 611 may be electrically connected to one side of the first line connecting pad 613. For example, at least a part of the first trace line 611 may be hidden by an insulating material.

According to various embodiments of the present invention, the first line connecting pad 613 may include, for example, a predetermined surface and may have one side connected to the first trace line 611 and an opposite side spaced apart from the second pattern 653 by a predetermined interval while facing the second pattern 653. For example, the first line connecting pad 613 may have a predetermined width in the vertical direction and may be arranged lengthwise. The width of the first line connecting pad 613 may be formed to be wider than the width of the first trace line 611.

According to various embodiments of the present invention, the first insulation layer 615 may be disposed to cover a partial area of the first line connecting pad 613, except a first exposure area 617. For example, the first insulation layer 615 may be disposed to cover an upper side of a region of the first line connecting pad 613 that faces the second pattern 653. Accordingly, the first line connecting pad 613 may include a portion not being hidden by the first insulation layer 615 and a portion hidden by the first line connecting pad 613. According to an embodiment, the first exposure area 617 may be provided at a distal end of a surface of the first line connecting pad 613 that faces the second pattern 653 and may be exposed to the outside by a partially cut-away area of the first insulation layer 615. The first exposure area 617 may serve as, for example, the first conductive pad illustrated in FIG. 4. The first exposure area 617 may be electrically connected with the second pattern 653 through the conductive material 659, at least a part of which is located in the first exposure area 617. An area where the first insulation layer 615 is not formed may be, for example, an area electrically connected with an RF connector when the RF connector is mounted.

According to various embodiments of the present invention, the second pattern 653 may include a second trace line 631, a second line connecting pad 633, and a second insulation layer 635.

According to various embodiments of the present invention, the second trace line 631 may have a predetermined line-width and length and may be connected to, for example, a contact part at one side thereof. An opposite side of the second trace line 631 may be electrically connected to one side of the second line connecting pad 633. For example, at least a part of the second trace line 631 may be hidden by an insulating material. The above-described second trace line 631 may be disposed to be symmetric to the first trace line 611 with respect to a specified virtual horizontal center line.

According to various embodiments of the present invention, the second line connecting pad 633 may include, for example, a predetermined surface and may have one side connected to the second trace line 631 and an opposite side spaced apart from the first line connecting pad 613 of the first pattern 651 by a predetermined interval while facing the first line connecting pad 613. For example, the second line connecting pad 633 may have a predetermined width in the vertical direction and may be arranged lengthwise. The width of the second line connecting pad 633 may be formed to be wider than the width of the second trace line 631. The second line connecting pad 633 may be disposed to be symmetric to, for example, the first line connecting pad 613 with respect to a specified virtual horizontal center line.

According to various embodiments of the present invention, the second insulation layer 635 may be disposed to cover a partial area of the second line connecting pad 633, except a second exposure area 637. According to an embodiment, the second line connecting pad 633 may include a portion not being hidden by the second insulation layer 635 and a portion hidden by the second line connecting pad 633. Furthermore, the second exposure area 637 may be provided at a distal end of a surface of the second line connecting pad 633 that faces the first pattern 651 and may be exposed to the outside by a partially cut-away area of the second insulation layer 635. The second exposure area 637 may serve as, for example, the second conductive pad illustrated in FIG. 4. The second exposure area 637 may be electrically connected with the first line connecting pad 613 of the first pattern 651 through the conductive material 659, at least a part of which is located in the second exposure area 637. An area where the second insulation layer 635 is not formed may be, for example, an area electrically connected with an RF connector when the RF connector is mounted.

According to various embodiments of the present invention, the first insulation layer 615 and the second insulation layer 635 may serve as dams for preventing the conductive material 659 from spreading to other areas of the line connecting pads while the conductive material 659 is being formed on the first exposure area 617 and the second exposure area 637.

According to various embodiments of the present invention, the third pattern 655 may include, for example, a first corner pattern 655a and a second corner pattern 655b. The fourth pattern 657 may include, for example, a third corner pattern 657a and a fourth corner pattern 657b. At least some of the patterns may be disposed to be symmetric to one another with respect to, for example, a specified virtual horizontal center line, a specified virtual vertical center line, a specified diagonal line, or the like. Metallic areas of the first pattern 651, the second pattern 653, the third pattern 655, and the fourth pattern 657 may be formed of the same material.

Figure 7:
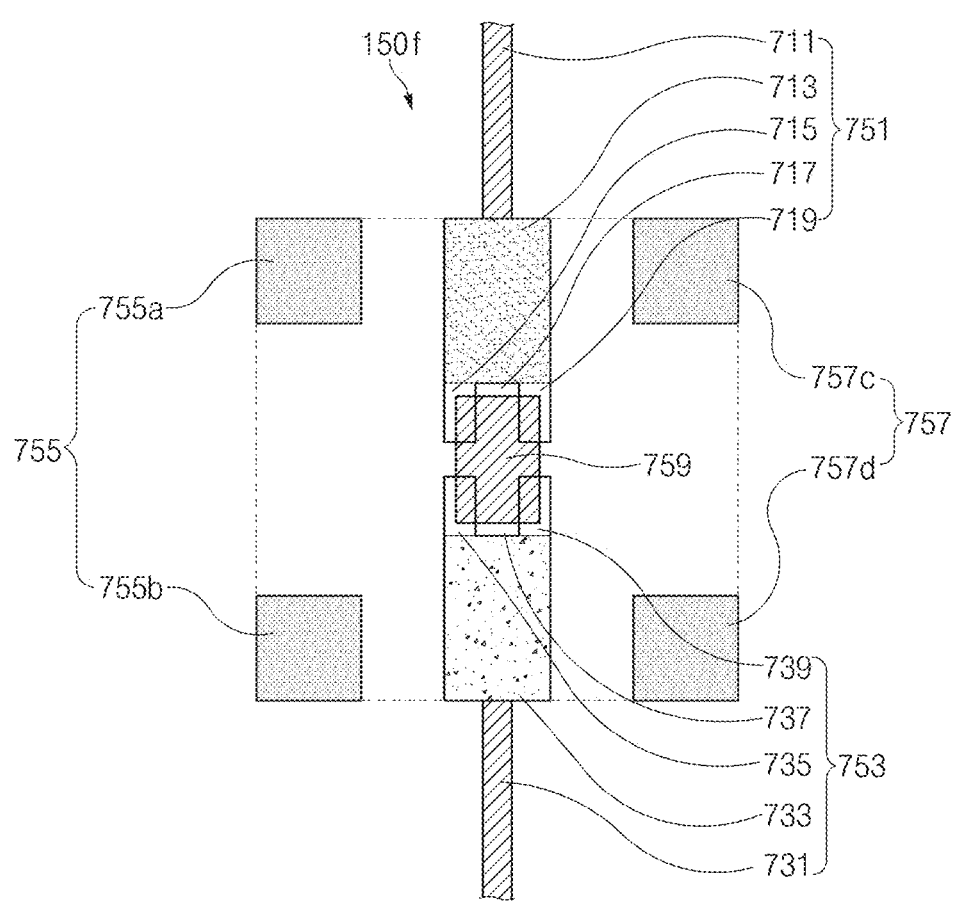
FIG. 7 illustrates another example of a pattern area section according to an embodiment.

FIG. 7 illustrates another example of a pattern area section according to an embodiment.

Referring to FIG. 7, a pattern area section 150*f* may include a first pattern 751, a second pattern 753, a third pattern 755, a fourth pattern 757, and a conductive material 759.

According to various embodiments of the present invention, the first pattern 751 may include a first trace line 711, a first line connecting pad 713, a first upper protruding area 715, a first home area 717, and a second upper protruding area 719. Additionally, the first pattern 751 may further include an insulation layer that covers a part of the first line connecting pad 713. The insulation layer may be disposed to cover a part of the first line connecting pad 713 that is adjacent to the first upper protruding area 715 and the second upper protruding area 719.

According to various embodiments of the present invention, the first trace line 711 may have a predetermined line-width and length and may be connected to a contact part at one side thereof. An opposite side of the first trace line 711 may be electrically connected to one side of the first line connecting pad 713. For example, at least a part of the first trace line 711 may be hidden by an insulating material.

According to various embodiments of the present invention, the first line connecting pad 713 may be connected to, for example, the first trace line 711 at one side thereof. The first line connecting pad 713 may have a first width and a first length and may be disposed to face the second pattern 753. The first upper protruding area 715 and the second upper protruding area 719 may be disposed on one side of the first line connecting pad 713 that faces the second pattern 753 and may be spaced apart from each other by a predetermined interval. The first home area 717 may be formed by the separation between the first upper protruding area 715 and the second upper protruding area 719. The first upper protruding area 715 may have a predetermined width and may extend a predetermined distance from one end of an edge of the first line connecting pad 713 toward the second pattern 753. The width of the first upper protruding area 715 may be smaller than the first width of the first line connecting pad 713. The second upper protruding area 719 may have a predetermined width and may extend a predetermined distance from an opposite end of the edge of the first line connecting pad 713 toward the second pattern 753 so as to be parallel with the first upper protruding area 715. The width of the second upper protruding area 719 may be smaller than the first width of the first line connecting pad 713. According to an embodiment, the second upper protruding area 719 may be formed to have a width similar to the width of the first upper protruding area 715.

According to various embodiments of the present invention, the second pattern 753 may include a second trace line 731, a second line connecting pad 733, a first lower protruding area 735, a second home area 737, and a second lower protruding area 739. Additionally, the second pattern 753 may further include an insulation layer that covers a part of the second line connecting pad 733. The insulation layer may be disposed to cover a part of the second line connecting pad 733 that is adjacent to the first lower protruding area 735 and the second lower protruding area 739.

According to various embodiments of the present invention, the second trace line 731 may have a predetermined line-width and length and may be connected to a contact part at one side thereof. An opposite side of the second trace line 731 may be electrically connected to one side of the second line connecting pad 733. For example, at least a part of the second trace line 731 may be hidden by an insulating material.

According to various embodiments of the present invention, the second line connecting pad 733 may be connected to, for example, the second trace line 731 at one side thereof. The second line connecting pad 733 may have a first width and a first length and may be disposed to face the first pattern 751. For example, the second line connecting pad 733 may have the first width and the first length similar to those of the first line connecting pad 713. The first lower protruding area 735 and the second lower protruding area 739 may be disposed on one side of the second line connecting pad 733 that faces the first pattern 751 and may be spaced apart from each other by a predetermined interval to form the second home area 737. The first lower protruding area 735 may have a predetermined width and may extend a predetermined distance from a distal end of the second line connecting pad 733 toward the first pattern 751. The width of the first lower protruding area 735 may be smaller than the first width of the second line connecting pad 733. The second lower protruding area 739 may extend from an end of an edge of the second line connecting pad 733 so as to be parallel with the first lower protruding area 735. The width of the second lower protruding area 739 may be smaller than the first width of the second line connecting pad 733. According to an embodiment, the second lower protruding area 739 may be formed to have a width similar to the width of the first lower protruding area 735.

According to various embodiments of the present invention, the conductive material 759 may be disposed to electrically connect the first pattern 751 and the second pattern 753. According to an embodiment, the conductive material 759 may be disposed to electrically connect a part of the first upper protruding area 715 and a part of the first lower protruding area 735. Furthermore, the conductive material 759 may be disposed to electrically connect a part of the second upper protruding area 719 and a part of the second lower protruding area 739. According to various embodiments, the conductive material 759 may be configured to electrically connect the first upper protruding area 715 and the second upper protruding area 719 or to electrically connect the first lower protruding area 735 and the second lower protruding area 739. Although it is exemplified in the illustrated drawing that the conductive material 759 is disposed to cover the protruding areas, various embodiments are not limited thereto. For example, according to an embodiment, the conductive material 759 may have a polygonal, circular, or oval strap shape to electrically connect the four protruding areas.

According to various embodiments of the present invention, the third pattern 755 may include a first sub-pattern 755*a* and a second sub-pattern 755*b*. The first sub-pattern 755*a* and the second sub-pattern 755*b* may have, for example, a rectangular or circular shape. The fourth pattern 757 may include a third sub-pattern 757*c* and a fourth sub-pattern 757*d*. At least some of the sub-patterns 755*a*, 755*b*, 757*c*, and 757*d* may be disposed to be symmetric to one another with respect to, for example, a specified virtual horizontal center line, a specified virtual vertical center line, a vertical diagonal line, or the like.

According to various embodiments of the present invention, in the case where an RF connector is not mounted, the pattern area section 150*f* having the above-described structure may form a signal line on the basis of the shortest route, without a separate bypass route based on a conductive material configured inward of a connector connecting part. The electronic device 100 does not need to separately modify a PCB and may provide a signal line on the basis of the shortest route even when an RF connector is not used. Accordingly, it is possible to prevent performance degradation in signal transmission of the electronic device.

According to the above-described various embodiments, an electronic device according to an embodiment may include a housing, a printed circuit board disposed inside the housing, a processor and a contact part that are disposed on the printed circuit board and process a communication function, a first conductive pattern electrically connected with the processor, a second conductive pattern electrically connected with the contact part and including a distal end spaced apart from a distal end of the first pattern by a predetermined interval, a connecting part that electrically connects the distal end of the first pattern and the distal end of the second pattern, a third conductive pattern spaced apart from the first pattern or the second pattern in a first direction, and a fourth conductive pattern spaced apart from the first pattern or the second pattern in a second direction that is different from the first direction.

According to various embodiments, the connecting part may include a conductive material that connects the distal end of the first pattern and the distal end of the second pattern.

According to various embodiments, at least one of the first pattern or the second pattern may include a first part having a first width and a predetermined length, a second part connected with the first part and having a second width greater than the first width, a third part connected with the second part and having a width smaller than the second width, and a fourth part connected with the third part and having a width greater than the width of the third part, According to various embodiments, the connecting part may connect the fourth part of the first pattern and the fourth part of the second pattern.

According to various embodiments, an insulation layer may be disposed on the first part and the third part.

According to various embodiments, at least one of the first pattern or the second pattern may include a first part having a first width and a predetermined length, a second part having a second width greater than the first width, and an insulation layer that covers a partial area of the second part and has an exposure area formed on a predetermined portion at a distal end of the insulation layer, and the connecting part may be disposed to connect the exposure area of the first pattern and the exposure area of the second pattern.

According to various embodiments, at least one of the first pattern or the second pattern may include a first part having a first width and a predetermined length, a second part having a second width greater than the first width, and at least one protruding area extending from a distal end of the second part toward the connecting part, and the connecting part may be disposed to connect the at least one protruding area of the first pattern and the at least one protruding area of the second pattern.

According to various embodiments, at least one of the third pattern and the fourth pattern may include a predetermined surface and may serve as a ground terminal.

According to various embodiments, at least one of the third pattern or the fourth pattern may have a polygonal or circular shape.

According to various embodiments, a plurality of third or fourth patterns may be arranged in a plurality of directions with respect to the first pattern and the second pattern.

According to the above-described various embodiments, a printed circuit board device according to an embodiment may include a processor and a contact part that are disposed on a substrate and process a communication function, a first conductive pattern electrically connected with the processor, a second conductive pattern electrically connected with the contact part and including a distal end spaced apart from a distal end of the first pattern by a predetermined interval, a connecting part that electrically connects the distal end of the first pattern and the distal end of the second pattern, a third conductive pattern spaced apart from the first pattern or the second pattern in a first direction, and a fourth conductive pattern spaced apart from the first pattern or the second pattern in a second direction that is different from the first direction.

Figure 8:
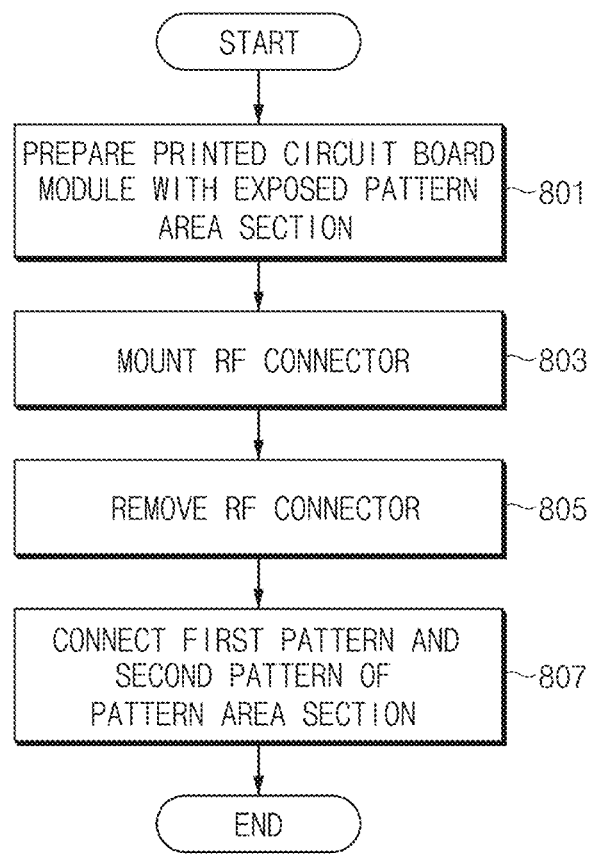
FIG. 8 is a view illustrating a method for processing a printed circuit board device according to an embodiment.

FIG. 8 is a view illustrating a method for processing a printed circuit board device according to an embodiment.

Referring to FIG. 8, according to various embodiments of the present invention, in operation 801, a printed circuit board device having an exposed connector connecting part may be prepared. Here, the printed circuit board device may include a processor, a contact part, the connector connecting part, and signal wires arranged thereon. The processor may be connected to the connector connecting part through the signal wires, and the contact part may also be connected to the connector connecting part through the signal wires. Since the connector connecting part is disconnected, the processor and the contact part may be electrically disconnected from each other.

In operation 803, according to various embodiments of the present invention, an RF connector may be mounted on the area of the connector connecting part. The processor may be connected to the RF connector through the signal wires by mounting the RF connector. In the case where an antenna is coupled to the RF connector, the processor may transmit signals through the RF connector or may collect signals received by the RF connector.

In operation 805, according to various embodiments of the present invention, the RF connector may be removed. In the case where a test based on the RF connector is completed, the RF connector may be removed from the connector connecting part. Accordingly, the connector connecting part may be exposed to the outside again. In this case, the connector connecting part, for example, a first pattern, a second pattern, a third pattern, a fourth pattern, and the like may be exposed, and the first pattern and the second pattern may be electrically disconnected from each other.

In operation 807, according to various embodiments of the present invention, a pattern area section may be provided by disposing a connecting part for electrically connecting the first pattern and the second pattern in the connector connecting part. According to an embodiment, the first pattern and the second pattern may be electrically connected by applying a conductive material between a distal end of the first pattern and a distal end of the second pattern. According to various embodiments, the connecting part may have at least one physical element (e.g., at least one of a capacitor, an inductor, and a resistance element) added thereto to electrically connect the first pattern and the second pattern.

While the present invention has been shown and described with reference to various embodiments thereof, it will be understood by those skilled in the art that various changes in form and details may be made therein without departing from the spirit and scope of the present invention as defined by the appended claims and their equivalents.

The invention claimed is:
1. An electronic device comprising:
a housing;
a printed circuit board disposed inside the housing;
a communication circuit disposed on the printed circuit board;
a first conductive pattern and a second conductive pattern electrically connected with the communication circuit;
a conductive material electrically connected between the first conductive pattern and the second conductive pattern;
a radio frequency (RF) connector electrically connected between the first conductive pattern and the second conductive pattern;
a third conductive pattern spaced apart from the first conductive pattern and/or the second conductive pattern in a first direction; and
a fourth conductive pattern spaced apart from the first conductive pattern and/or the second conductive pattern in a second direction opposite to the first direction,
wherein the first conductive pattern and the second conductive pattern each include:
a first part having a first width; and
a second part having a second width greater than the first width, and
wherein at least a part of the conductive material is disposed on the second part of the first conductive pattern and the second part of the second conductive pattern.

2. The electronic device of claim 1, wherein the second part of the first conductive pattern and the second part of the second conductive pattern are disposed in an area surrounded by the third conductive pattern and the fourth conductive pattern, or
wherein the first part and the second part of the first conductive pattern and the first part and the second part of the second conductive pattern are arranged on one virtual line in the area surrounded by the third conductive pattern and the fourth conductive pattern.

3. The electronic device of claim 1, wherein the first conductive pattern and the second conductive pattern each further include:
a third part having a third width that is different from the first width and the second width.

4. The electronic device of claim 3, wherein the first part, the second part, and the third part of the first conductive pattern and the first part, the second part, and the third part of the second conductive pattern are substantially arranged on one virtual line in an area surrounded by the third conductive pattern and the fourth conductive pattern.

5. The electronic device of claim 1, wherein the conductive material includes a material that is different from a material included in the first conductive pattern and/or a material included in the second conductive pattern.

6. The electronic device of claim 1, wherein the printed circuit board includes at least one ground, and
wherein the third conductive pattern and/or the fourth conductive pattern is electrically connected with the at least one ground.

7. The electronic device of claim 1, wherein a width between the third conductive pattern and the fourth conductive pattern or a length of the third conductive pattern or the fourth conductive pattern ranges from 1 mm to 5 mm.

8. A printed circuit board device comprising:
a processor and a contact part disposed on a substrate and configured to process a communication function;
a first conductive pattern electrically connected with the processor and a second conductive pattern electrically connected with the contact part and including a distal end spaced apart from a distal end of the first pattern by a predetermined interval;
a connecting part configured to electrically connect the distal end of the first pattern and the distal end of the second pattern;
a radio frequency (RF) connector electrically connected between the first conductive pattern and the second conductive pattern; and
a third conductive pattern spaced apart from the first pattern or the second pattern in a first direction and a fourth conductive pattern spaced apart from the first pattern or the second pattern in a second direction that is different from the first direction.

9. The printed circuit board device of claim 8, wherein the connecting part includes:
a conductive material configured to connect the distal end of the first pattern and the distal end of the second pattern.

10. The printed circuit board device of claim 8, wherein at least one of the first pattern or the second pattern includes:
a first part having a first width and a predetermined length;
a second part connected with the first part and having a second width greater than the first width;
a third part connected with the second part and having a width smaller than the second width; and
a fourth part connected with the third part and having a width greater than the width of the third part.

11. The printed circuit board device of claim 10, wherein the connecting part is configured to connect the fourth part of the first pattern and the fourth part of the second pattern.

12. The printed circuit board device of claim 8, wherein at least one of the first pattern or the second pattern includes a first part having a first width and a predetermined length, a second part connected with the first part and having a second width greater than the first width, a third part connected with the second part and having a width smaller than the second width, and a fourth part connected with the third part and having a width greater than the width of the third part, and an insulation layer is disposed on the first part and the third part or an insulation layer is disposed on the second part and the third part;
wherein at least one of the first pattern or the second pattern includes a first part having a first width and a predetermined length, a second part having a second width greater than the first width, and an insulation layer configured to cover a partial area of the second part and having an exposure area formed on a predetermined portion at a distal end of the insulation layer, and the connecting part is disposed to connect the exposure area of the first pattern and the exposure area of the second pattern; or
wherein at least one of the first pattern or the second pattern includes a first part having a first width and a predetermined length, a second part having a second width greater than the first width, and at least one protruding area extending from a distal end of the second part toward the connecting part, and the connecting part is disposed to connect the at least one protruding area of the first pattern and the at least one protruding area of the second pattern.

13. The printed circuit board device of claim 8, wherein at least one of the third pattern and the fourth pattern includes a predetermined surface and serves as a ground terminal.

14. The printed circuit board device of claim 8, wherein at least one of the third pattern or the fourth pattern has a polygonal or circular shape, and
   wherein a plurality of third or fourth patterns are arranged in a plurality of directions with respect to the first pattern and the second pattern.

* * * * *